United States Patent
Pan et al.

(10) Patent No.: US 8,039,946 B2
(45) Date of Patent: Oct. 18, 2011

(54) CHIP PACKAGE STRUCTURE AND FABRICATING METHOD THEREOF

(75) Inventors: Hua Pan, Shanghai (CN); Jie-Hung Chiou, Shanghai (CN); Chih-Lung Huang, Shanghai (CN)

(73) Assignees: ChipMOS Technologies (Shanghai) Ltd., Shanghai (CN); ChipMOS Technologies (Bermuda) Ltd., Hamilton (BM)

( * ) Notice: Subject to any disclaimer, the term of this patent is extended or adjusted under 35 U.S.C. 154(b) by 0 days.

(21) Appl. No.: 12/630,103

(22) Filed: Dec. 3, 2009

(65) Prior Publication Data

US 2010/0078802 A1   Apr. 1, 2010

Related U.S. Application Data

(62) Division of application No. 11/530,178, filed on Sep. 8, 2006, now abandoned.

(30) Foreign Application Priority Data

Jul. 11, 2006 (TW) ................................ 95125198 A

(51) Int. Cl.
*H01L 23/495* (2006.01)
*H01L 21/60* (2006.01)

(52) U.S. Cl. ........ 257/691; 257/668; 257/676; 257/692; 257/E23.031; 257/E23.032; 257/E23.039; 257/E23.153; 361/813; 438/123

(58) Field of Classification Search ............... 257/668, 257/676, 691, E23.031, E23.032, E23.039, 257/692, E23.153; 361/813; 438/123
See application file for complete search history.

(56) References Cited

U.S. PATENT DOCUMENTS

| | | | |
|---|---|---|---|
| 5,168,368 A * | 12/1992 | Gow et al. ................ 257/666 |
| 5,293,066 A * | 3/1994 | Tsumura ................... 257/668 |
| 5,723,899 A * | 3/1998 | Shin ......................... 257/666 |
| 5,917,235 A * | 6/1999 | Imura ....................... 257/669 |
| 6,686,651 B1 * | 2/2004 | Foster ....................... 257/666 |
| 2002/0024122 A1 * | 2/2002 | Jung et al. ................ 257/666 |
| 2003/0042583 A1 * | 3/2003 | Chen et al. ............... 257/666 |

* cited by examiner

*Primary Examiner* — Eugene Lee
*Assistant Examiner* — Peniel M Gumedzoe
(74) *Attorney, Agent, or Firm* — J.C. Patents

(57) ABSTRACT

A chip package structure including a chip, a lead frame, first bonding wires and second bonding wires is provided. The chip has an active surface and chip bonding pads disposed thereon. The lead frame is fixed on the chip and the lead frame includes inner leads, at least one bus bar, an insulating layer and transfer bonding pads. The bus bar is located between the chip bonding pads and the inner leads. The insulating layer is disposed on the bus bar and the transfer bonding pads are disposed thereon. The inner leads and the bus bar are located above the active surface. The chip and the insulating layer are located respectively on two opposite surfaces of the bus bar. The first bonding wires respectively connect the chip bonding pads and the transfer bonding pads. The second bonding wires respectively connect the transfer bonding pads and the inner leads.

10 Claims, 10 Drawing Sheets

CHIP PACKAGE STRUCTURE AND FABRICATING METHOD THEREOF

CROSS-REFERENCE TO RELATED APPLICATION

This application is a divisional application of and claims the priority benefit of application Ser. No. 11/530,178, filed on Sep. 8, 2006, which claims the priority benefit of Taiwan application serial no. 95125198, filed on Jul. 11, 2006. The entirety of each of the above-mentioned patent applications is hereby incorporated by reference herein and made a part of specification.

BACKGROUND OF THE INVENTION

1. Field of Invention

The present invention relates to a semiconductor device and a fabricating method thereof. More particularly, the present invention relates to a chip package structure and a fabricating method thereof.

2. Description of Related Art

In the semiconductor industry, the fabrication of an integrated circuit (IC) is mainly divided into three stages: IC design, IC process and IC package.

During the fabrication of ICs, a chip is made by the steps of wafer fabricating, IC forming, wafer sawing and so on. The wafer has an active surface, which generally refers to a surface having active devices of the wafer. When the IC on the wafer is finished, a plurality of bonding pads is further disposed on the active surface of the wafer, such that the chip formed by wafer sawing is electrically connected to a carrier outward via the bonding pads. The carrier is, for example, a lead frame or a package substrate. The chip can be connected to the carrier by means of wire bonding or flip-chip bonding, such that the bonding pads of the chip are electrically connected to the contacts of the carrier, thus forming a chip package structure.

FIG. 1A is a schematic sectional side view of a conventional chip package structure. FIG. 1B is a schematic top view of a portion of the members of the chip package structure in FIG. 1A. Referring to FIGS. 1A and 1B, a conventional chip package structure 100 comprises a chip 110, a lead frame 120, a plurality of first bonding wires 130, a plurality of second bonding wires 140, a plurality of third bonding wires 150 and an encapsulant 160. The chip 110 has an active surface 112 and a plurality of first bonding pads 114 and second bonding pads 116 disposed on the active surface 112. The chip 110 is fixed below the lead frame 120, and the lead frame 120 includes a plurality of inner leads 122 and a bus bar 124. The inner leads 122 and the bus bar 124 are located above or below the active surface 112 of the chip 110, and the bus bar 124 is in an annular shape.

Referring to FIG. 1B, as the first bonding pads 114 of the chip 110 have the same electric potential, and the first bonding pads 114 are, for example, ground bonding pads or power supply bonding pads, thus the first bonding pads 114 of the same electric potential are respectively connected to the bus bar 124 via the first bonding wires 130, and the bus bar 124 is further connected to the corresponding portion of the inner leads 122 via the second bonding wires 140. However, the second bonding pads 116 of the chip 110 for transmitting signals (for example, signal bonding pads with ever-changing electric potentials) must be connected to other corresponding inner leads 122 via the third bonding wires 150, and the third bonding wires 150 usually have to cross a portion of the first bonding wires 130, a portion of the second bonding wires 140 and the bus bar 124. Therefore, the third bonding wires 150 are quite long, which is likely to make the third bonding wires 150 collapsed, thereby causing electric shorts. Or, the third bonding wires 150 may be collapsed during molding or being pulled apart by the injected encapsulant, thus causing electric broken circuits.

SUMMARY OF THE INVENTION

An objective of the present invention is to provide a chip package structure, so as to reduce the possibility of the collapse of the bonding wires.

Another objective of the present invention is to provide a method of fabricating the chip package structure, so as to improve the product yield of the chip package structure.

To achieve the above or other objectives, the present invention provides a chip package structure, which comprises a chip, a lead frame, a plurality of first bonding wires and a plurality of second bonding wires. The chip has an active surface and a plurality of chip bonding pads disposed on the active surface. The lead frame fixed on the chip and the lead frame comprises a plurality of inner leads, at least one bus bar, an insulating layer and a plurality of transfer bonding pads. The bus bar is located between the chip bonding pads and the inner leads. The insulating layer is disposed on the bus bar. The transfer bonding pads are disposed on the insulating layer. The inner leads and the bus bar are located above the active surface of the chip. The chip and the insulating layer are located respectively on two opposite surfaces of the bus bar. The first bonding wires respectively connect the chip bonding pads and the transfer bonding pads. The second bonding wires respectively connect the transfer bonding pads and the inner leads.

In an embodiment of the present invention, the bus bar can be in an annular shape.

In an embodiment of the present invention, the bus bar can be in a strip shape.

In an embodiment of the present invention, the chip package structure further comprises an encapsulant, so as to cover the active surface, the inner leads, the bus bar, the first bonding wires and the second bonding wires.

To achieve the above or other objectives, the present invention provides a chip package structure, which comprises a chip, a lead frame, a plurality of first bonding wires and a plurality of second bonding wires. The chip has an active surface and a plurality of chip bonding pads disposed on the active surface. The lead frame comprises a die pad, a plurality of inner leads, at least one bus bar, an insulating layer and a plurality of transfer bonding pads. The chip is disposed on the die pad and the active surface is away from the die pad. The bus bar is located between the die pad and the inner leads. The insulating layer is disposed on the bus bar. The transfer bonding pads are disposed on the insulating layer. The first bonding wires respectively connect the chip bonding pads and the transfer bonding pads. The second bonding wires respectively connect the transfer bonding pads and the inner leads.

In an embodiment of the present invention, the bus bar can be in an annular shape.

In an embodiment of the present invention, the bus bar can be in a strip-shape.

In an embodiment of the present invention, the chip package structure further comprises an encapsulant, so as to cover the active surface, the die pad, the inner leads, the bus bar, the first bonding wires and the second bonding wires.

To achieve the above or other objectives, the present invention provides a method of fabricating the chip package structure, which comprises the following steps. First, a lead frame comprising a plurality of inner leads and at least one bus bar is provided. Then, an insulating layer is formed on the bus bar. Next, a plurality of transfer bonding pads is formed on the insulating layer. Afterward, a chip having an active surface and a plurality of chip bonding pads disposed on the active surface is provided. Thereafter, the chip is fixed below the lead frame, such that the inner leads and the bus bar are located above the active surface of the chip, and the chip and the insulating layer are located on two opposite surfaces of the bus bar. Next, a plurality of first bonding wires is formed to respectively connect the chip bonding pads and the transfer bonding pads. A plurality of second bonding wires is then formed to respectively connect the transfer bonding pads and the inner leads.

In an embodiment of the present invention, the above method of fabricating the chip package structure further comprises forming an encapsulant for covering the active surface, the inner leads, the bus bar, the first bonding wires and the second bonding wires.

To achieve the above or other objectives, the present invention provides a method of fabricating the chip package structure, which comprises the following steps. First, a lead frame comprising a die pad, a plurality of inner leads and at least one bus bar is provided, wherein the bus bar is located between the die pad and the inner leads. Then, an insulating layer is formed on the bus bar. Next, a plurality of transfer bonding pads is formed on the insulating layer. Afterward, a chip having an active surface and a plurality of chip bonding pads disposed on the active surface is provided. Thereafter, the chip is fixed on the die pad, wherein the active surface is away from the die pad. Next, a plurality of first bonding wires is formed to respectively connect the chip bonding pads and the transfer bonding pads. A plurality of second bonding wires is then formed to respectively connect the transfer bonding pads and the inner leads.

In an embodiment of the present invention, the above method of fabricating the chip package structure further comprises forming an encapsulant for covering the active surface, the die pad, the inner leads, the bus bar, the first bonding wires and the second bonding wires.

In view of the above, in the present invention, the transfer bonding pads are formed on the bus bar and are used as transfer points for the chip bonding pads being electrically connected to the inner leads respectively, so the desired first bonding wires and second bonding wires are very short, thus reducing the possibility of the collapse of the first bonding wires and the second bonding wires. In addition, as the first bonding wires and the second bonding wires are very short, the possibility of the first bonding wires and the second bonding wires being collapsed during molding or being pulled apart by the injected encapsulant may be reduced.

In order to make the aforementioned and other objectives, features and advantages of the present invention comprehensible, preferred embodiments accompanied with figures are described in detail below.

DESCRIPTION OF EMBODIMENTS

The First Embodiment

Figure 2A:
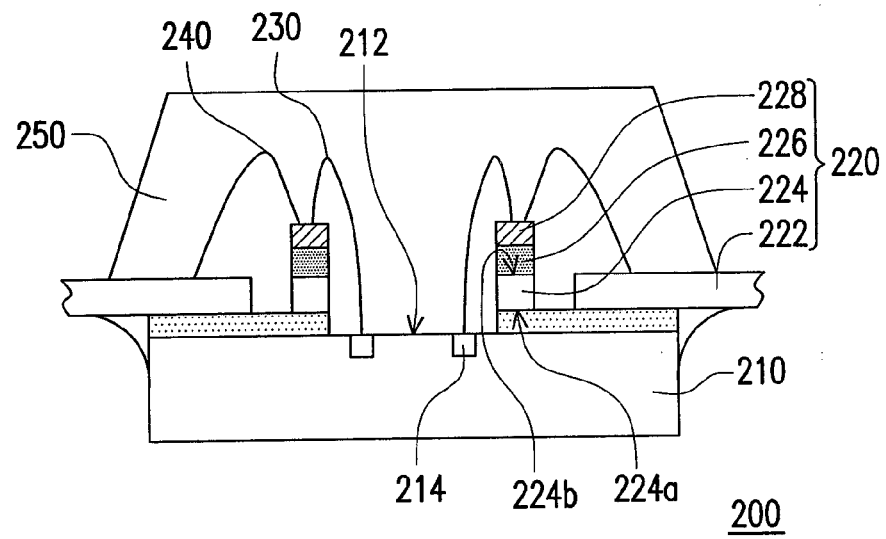
FIG. 2A is a schematic sectional side view of a chip package structure according to the first embodiment of the present invention.
Figure 2B:
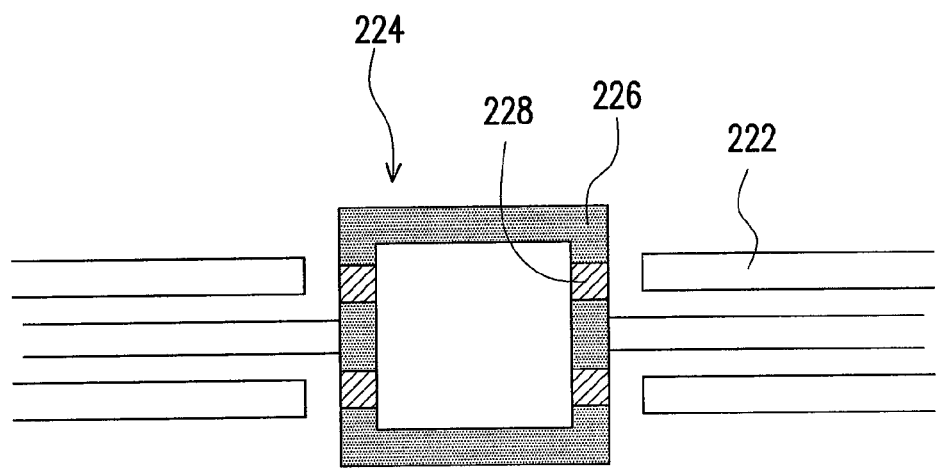
FIG. 2B is a schematic top view of the lead frame of the chip package structure in FIG. 2A.

FIG. 2A is a schematic sectional side view of a chip package structure according to the first embodiment of the present invention. FIG. 2B is a schematic top view of the lead frame of the chip package structure in FIG. 2A. Referring to FIGS. 2A and 2B, a chip package structure 200 of the first embodiment comprises a chip 210, a lead frame 220, a plurality of first bonding wires 230 and a plurality of second bonding wires 240. The chip 210 has an active surface 212 and a plurality of chip bonding pads 214 disposed on the active surface 212. In addition, the chip bonding pads 214 may be ground bonding pads, power supply bonding pads or signal bonding pads.

The lead frame 220 fixed on the chip 210 comprises a plurality of inner leads 222, at least one bus bar 224, an insulating layer 226 and a plurality of transfer bonding pads 228. The bus bar 224 is located between the chip bonding pads 214 and the inner leads 222. The insulating layer 226 is disposed on the bus bar 224. The transfer bonding pads 228 are disposed on the insulating layer 226. The inner leads 222 and the bus bar 224 are located above the active surface 212 of the chip 210. The chip 210 and the insulating layer 226 are respectively located on two opposite surfaces 224a, 224b of the bus bar 224.

The first bonding wires 230 are used to respectively connect the chip bonding pads 214 to the transfer bonding pads 228. The second bonding wires 240 are used to respectively connect the transfer bonding pads 228 to the inner leads 222. In the first embodiment, the chip package structure 200 further comprises an encapsulant 250, so as to cover the active surface 212, the inner leads 222, the bus bar 224, the first bonding wires 230 and the second bonding wires 240.

Figure 1A:
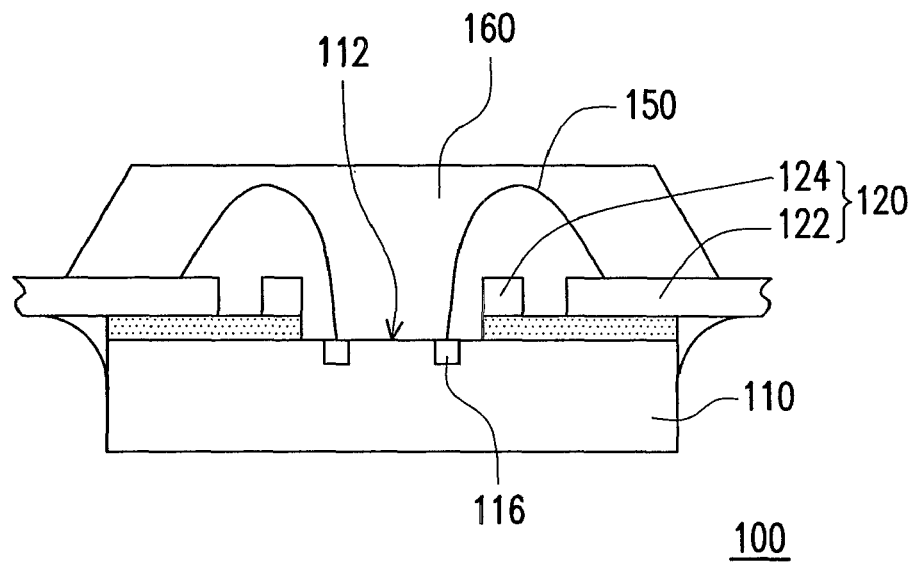
FIG. 1A is a schematic sectional side view of a conventional chip package structure.
Figure 1B:
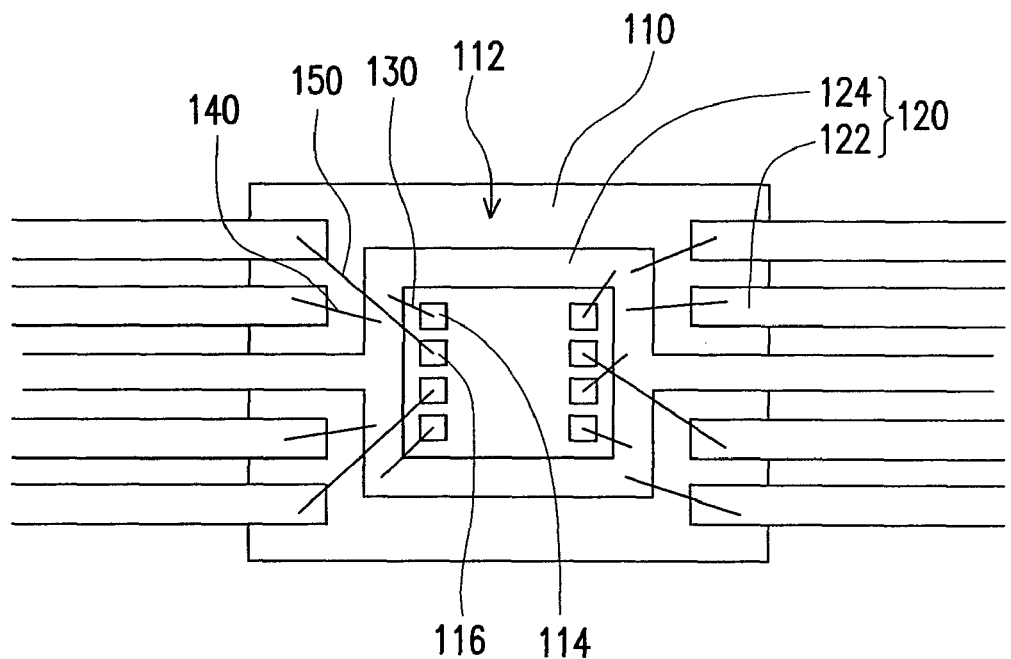
FIG. 1B is a schematic top view of a portion of the members of the chip package structure in FIG. 1A.

It should be illustrated that, comparing the chip package structure 200 in the first embodiment with the conventional chip package structure 100 (referring to FIGS. 1A and 1B), the chip bonding pads 214 are respectively connected to the transfer bonding pads 228 by the first bonding wires 230, and the transfer bonding pads 228 are respectively connected to the inner leads 222 by the second bonding wires 240. In other words, the transfer bonding pads 228 function as the transfer points for the chip bonding pads 214 being electrically connected to the inner leads 222 correspondingly. Therefore, the first bonding wires 230 and the second bonding wires 240 are very short, thus eliminating the disadvantage of the conventional package structure 100, and thereby raising the product yield of the chip package structure 200 of the first embodiment.

Figure 2C:
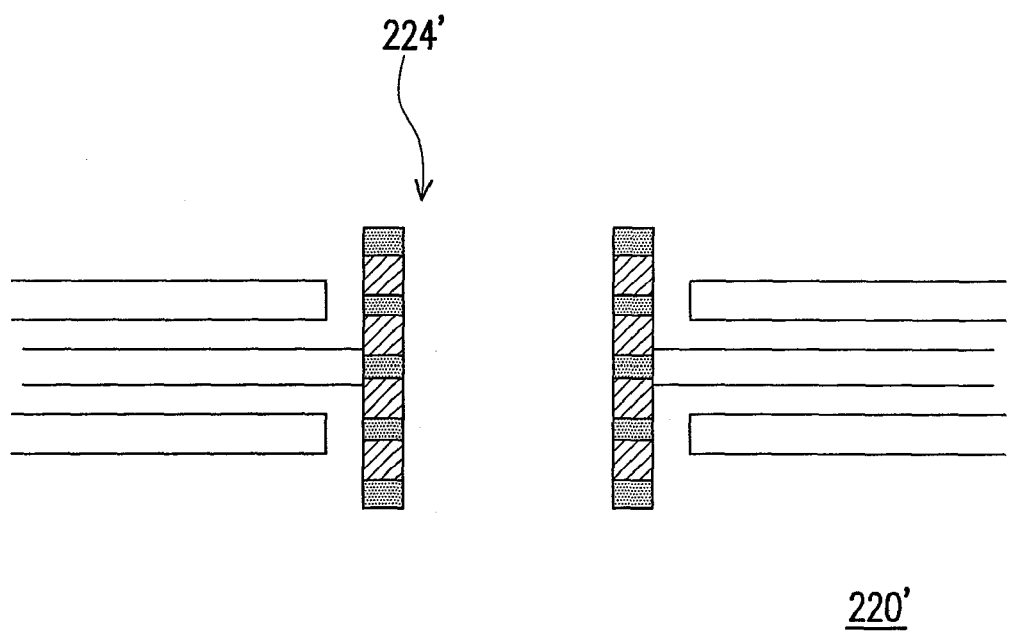
FIG. 2C is a schematic top view of the lead frame of the chip package structure according to another embodiment of the present invention.

In the first embodiment, the shape of the bus bar 224 is annular and the quantity thereof is one. However, the appearance and quantity of the bus bar 224 may be varied according to the design requirement, i.e., the first embodiment is used to illustrate instead of to limit the present invention. For example, referring to FIG. 2C, it is a schematic top view of the lead frame of the chip package structure according to another embodiment of the present invention. In another embodiment, the bus bar 224' of the lead frame 220' may be strip-shaped and the quantity of the bus bar 224' may be several. Moreover, in the present embodiment, all the chip bonding pads 214 have the corresponding transfer bonding pads 228 for wire jumping. However, the present invention does not limit that every chip bonding pad must have a jumper wire.

The method of fabricating the chip package structure 200 in the first embodiment is illustrated below. FIGS. 3A to 3F are schematic views of the method of fabricating the chip package structure according to the first embodiment of the present invention. The method comprises the following steps. First, referring to FIG. 3A, a lead frame 220 including a plurality of inner leads 222 and at least one bus bar 224 is provided.

Figure 3A:
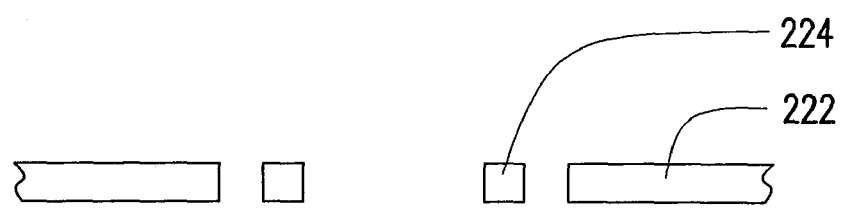
FIGS. 3A to 3F are schematic views of the method of fabricating the chip package structure according to the first embodiment of the present invention.
Figure 3B:
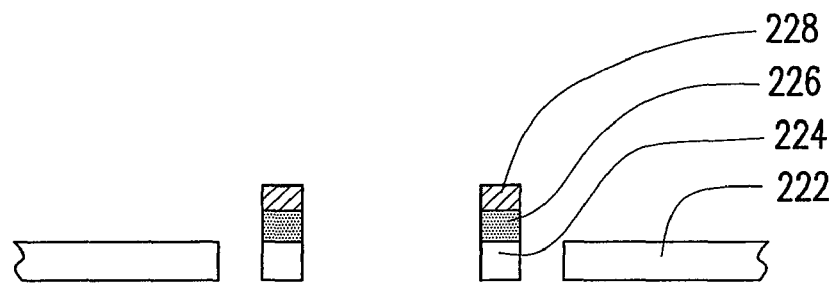

Then, referring to FIG. 3B, an insulating layer 226 is formed on the bus bar 224. In the first embodiment, the insulating layer 226 is formed by chemical vapor deposition (CVD) process. Then, a plurality of transfer bonding pads 228 is formed on the insulating layer 226. In the first embodiment, a conductive material layer (not shown) can be formed on the insulating layer 226 by sputtering process, physical vapor deposition or other film deposition processes. After that, a patterning process (e.g., lithography process and etching process) is performed for the conductive material layer, so as to form a plurality of transfer bonding pads 228 on the insulating layer 226.

Figure 3C:
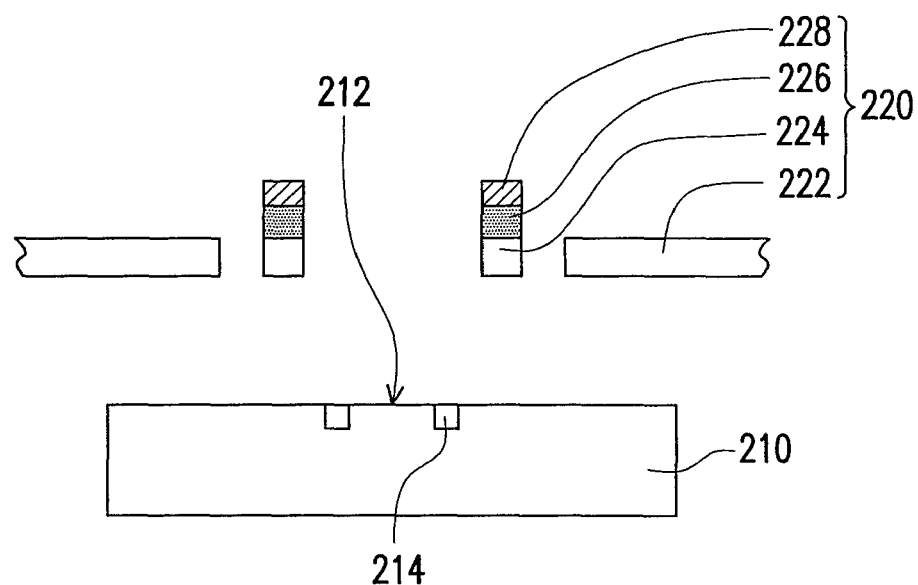
Figure 3D:
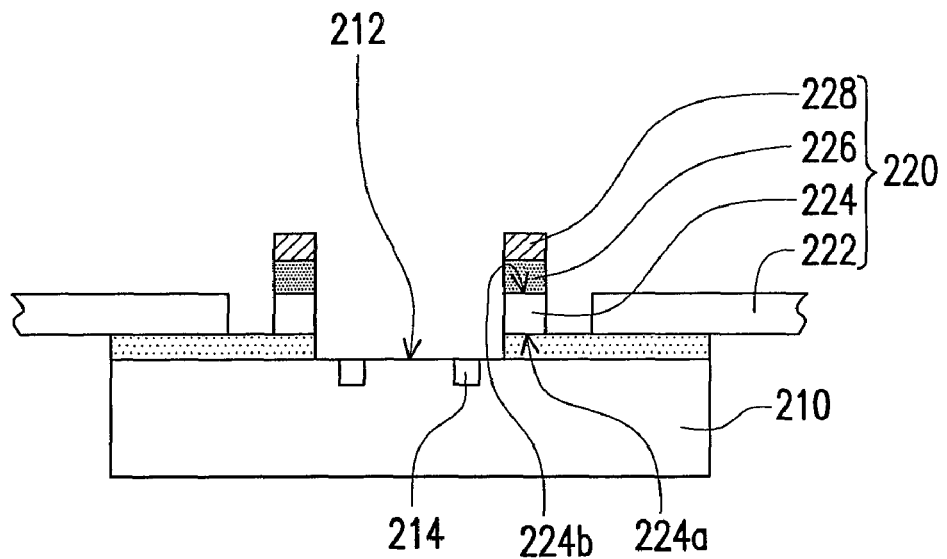

Next, referring to FIG. 3C, a chip 210 is provided. The chip 210 has an active surface 212 and a plurality of chip bonding pads 214, wherein the chip bonding pads 214 are disposed on the active surface 212. Afterward, referring to FIG. 3D, the chip 210 is fixed below the lead frame 220, such that the inner leads 222 and the bus bar 224 are located above the active surface 212 of the chip 210, and the chip 210 and the insulating layer 226 are respectively located on two opposite surfaces 224a, 224b of the bus bar 224.

Figure 3E:
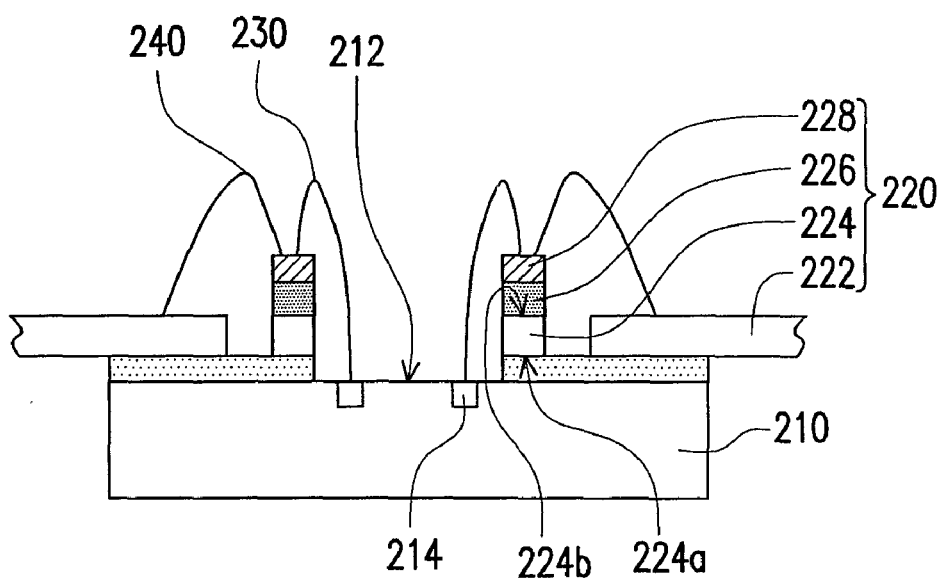
Figure 3F:
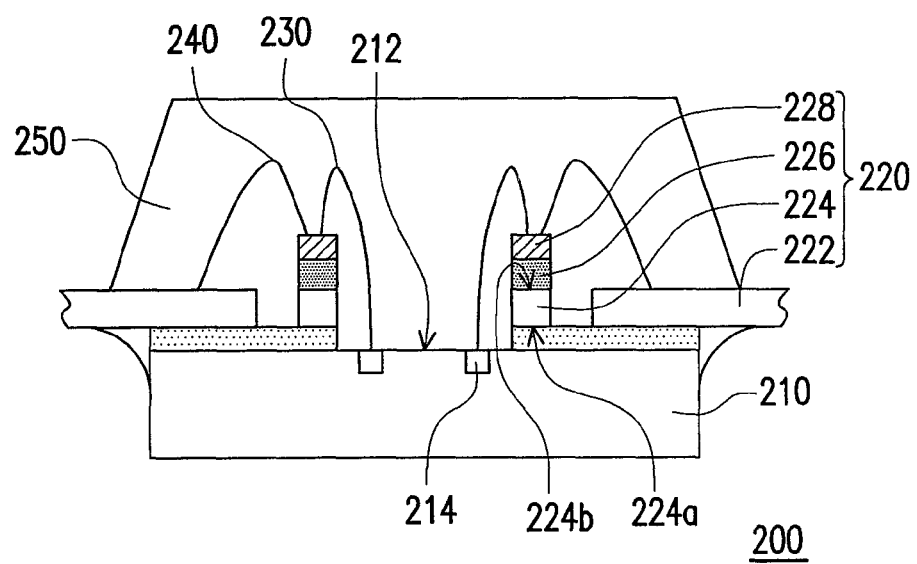

Afterward, referring to FIG. 3E, a wiring process is performed to form a plurality of first bonding wires 230, so as to respectively connect the chip bonding pads 214 and the transfer bonding pads 228. Next, a plurality of second bonding wires 240 is formed sequentially to connect the transfer bonding pads 228 and the inner leads 222 respectively. Referring to FIG. 3F, in the first embodiment, the method of fabricating the chip package structure 200 further comprises forming an encapsulant 250 to cover the active surface 212, the inner leads 222, the bus bar 224, the first bonding wires 230 and the second bonding wires 240. The chip package structure 200 of the first embodiment is achieved through the above steps.

It should be stressed that, in the present embodiment, the transfer bonding pads 228 are formed on the bus bar 224 for facilitating wire jumping. More particularly, as the first bonding wires 230 and the second bonding wires 240 are very short, the possibility of electric shorts caused by the collapse of the first bonding wires 230 and the second bonding wires 240 is reduced. Or, the possibility of electric broken circuits caused by the collapse of the first bonding wires 230 and the second bonding wires 240 during the molding process or being pulled apart by the injected encapsulant 260 is reduced, thereby improving the product yield of the chip package structure 200 of the first embodiment.

The Second Embodiment

Figure 4A:
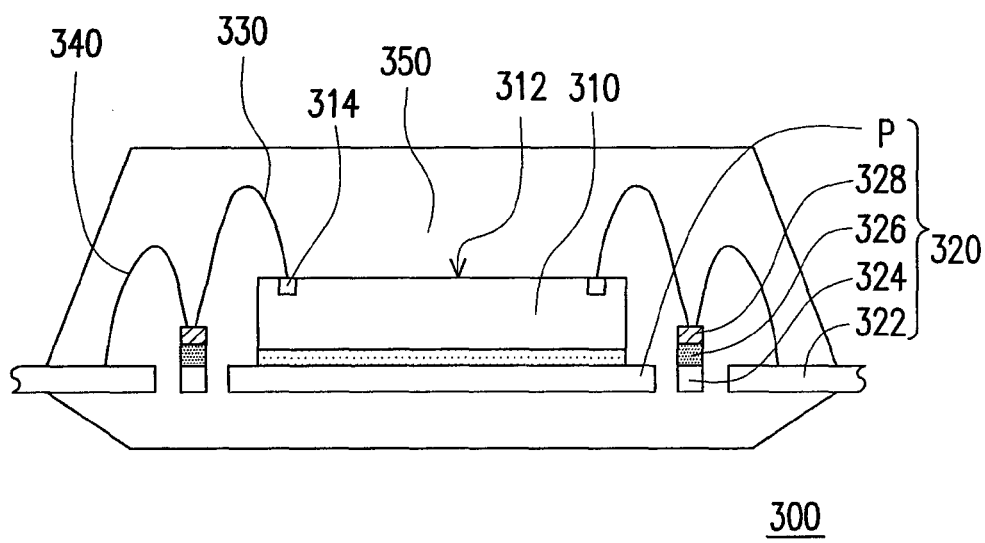
FIG. 4A is a schematic sectional side view of a chip package structure according to the second embodiment of the present invention.
Figure 4B:
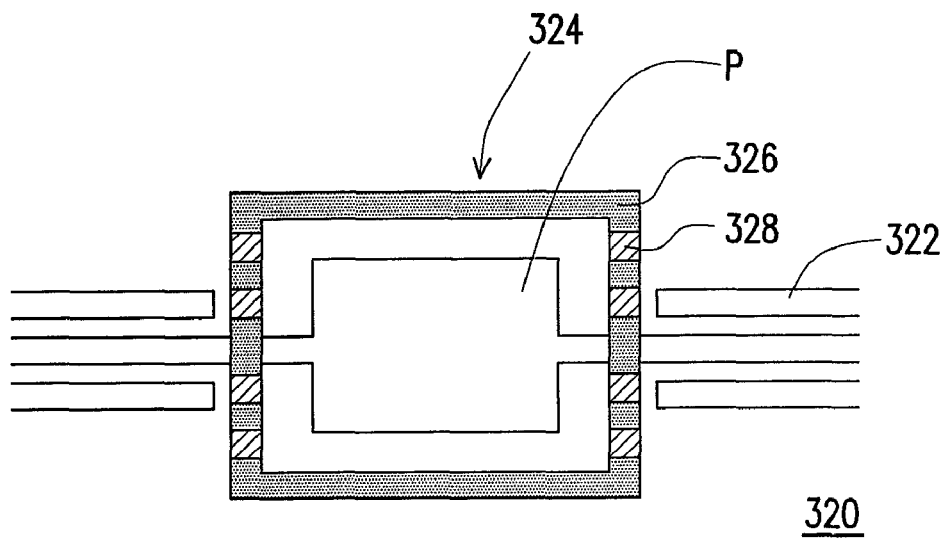
FIG. 4B is a schematic top view of the lead frame of the chip package structure in FIG. 4A.

FIG. 4A is a schematic sectional side view of a chip package structure according to the second embodiment of the present invention. FIG. 4B is a schematic top view of the lead frame of the chip package structure in FIG. 4A. Referring to FIGS. 4A and 4B, the main difference between a chip package structure 300 in the second embodiment and the chip package structure 200 in the first embodiment is that: a lead frame 320 of the chip package structure 300 comprises a die pad P, a plurality of inner leads 322, at least one bus bar 324, an insulating layer 326 and a plurality of transfer bonding pads 328. The chip 310 is disposed on the die pad P, and the active surface 312 is away from the die pad P. In other words, as for the relative position in FIG. 4A, the active surface 312 of the chip 310 faces upward. In addition, the bus bar 324 is located between the die pad P and the inner leads 322.

The method of fabricating the chip package structure 300 according to the second embodiment is illustrated below. FIGS. 5A to 5F are schematic views of the method of fabricating the chip package structure according to the second embodiment of the present invention. The method of the second embodiment comprises the following steps. First, referring to FIG. 5A, a lead frame 320 is provided. The lead frame 320 has a die pad P, a plurality of inner leads 322 and at least one bus bar 324, wherein the bus bar 324 is located between the die pad P and the inner leads 322.

Figure 5A:
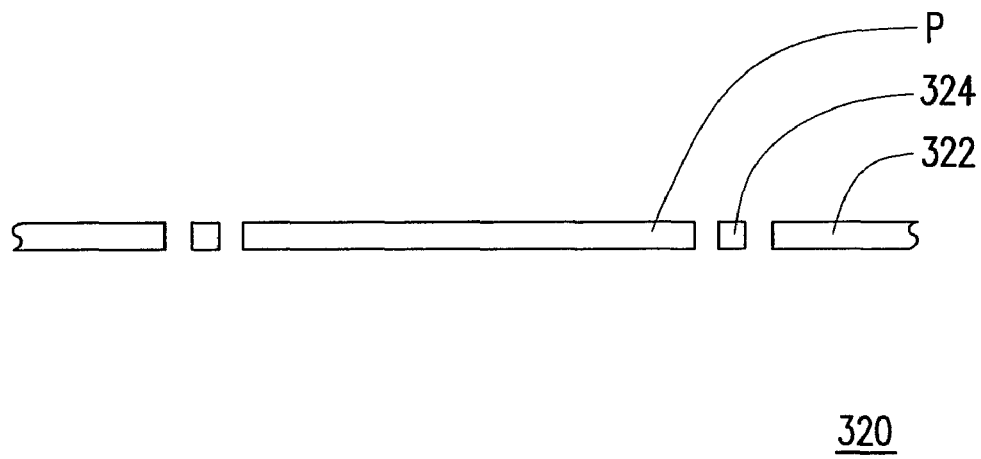
FIGS. 5A to 5F are schematic views of the method of fabricating the chip package structure according to the second embodiment of the present invention.
Figure 5B:
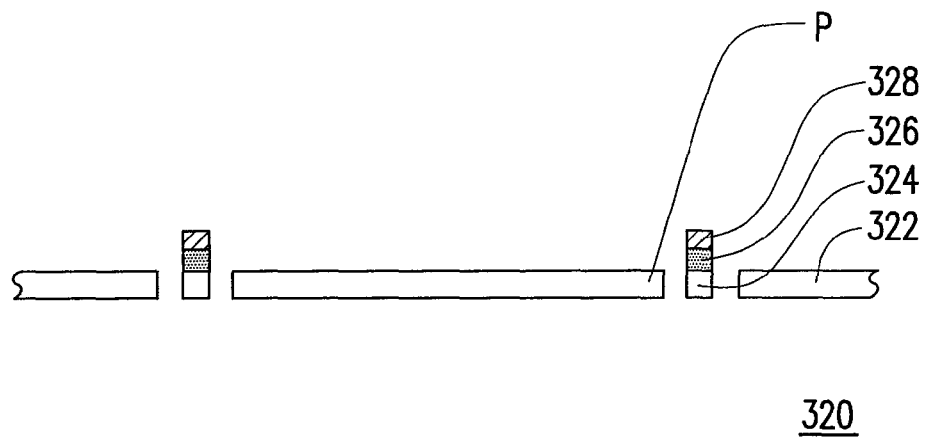

Then, referring to FIG. 5B, an insulating layer 326 is formed on the bus bar 324 in the same manner as illustrated in the first embodiment. Thereafter, a plurality of transfer bonding pads 328 is formed on the insulating layer 326 in the same manner as illustrated in the first embodiment.

Figure 5C:
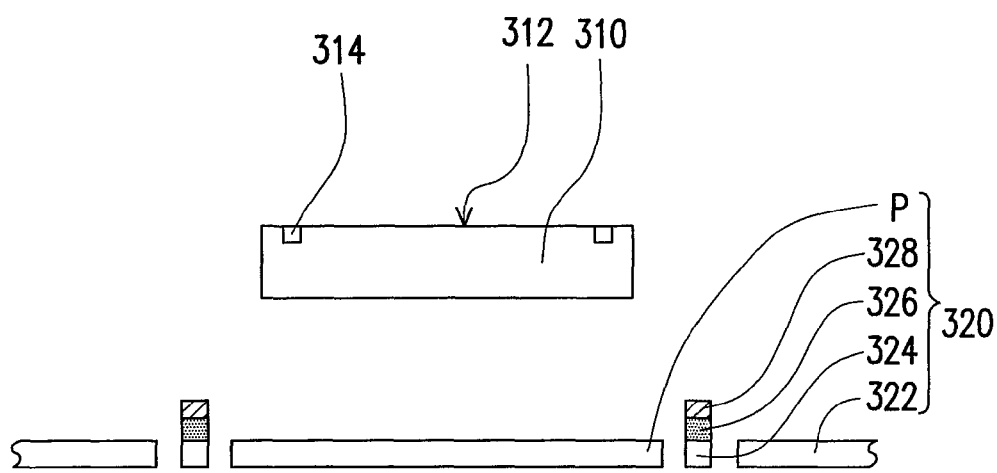
Figure 5D:
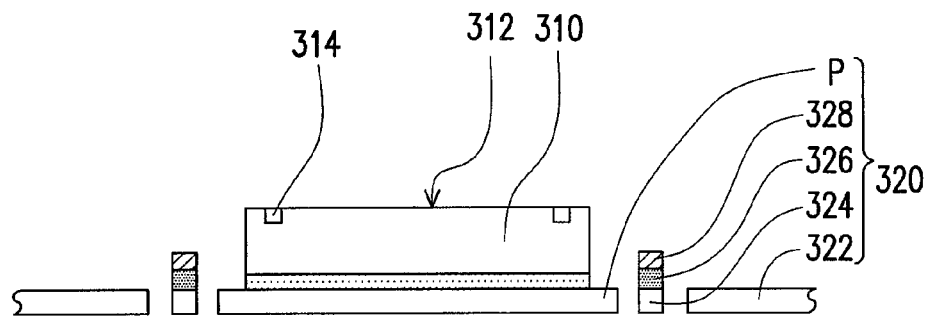

After that, referring to FIG. 5C, a chip 310 is provided. The chip has an active surface 312 and a plurality of chip bonding pads 314, wherein the chip bonding pads 314 are disposed on the active surface 312. Then, referring to FIG. 5D, the chip 310 is fixed on the die pad P, wherein the active surface 312 is away from the die pad P.

Figure 5E:
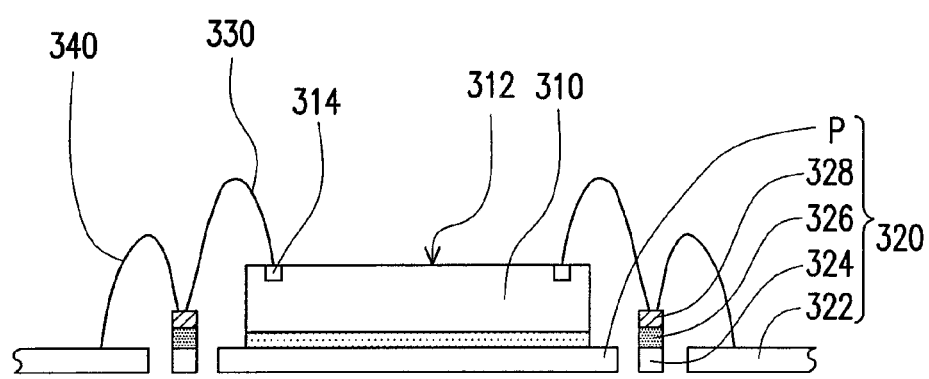
Figure 5F:
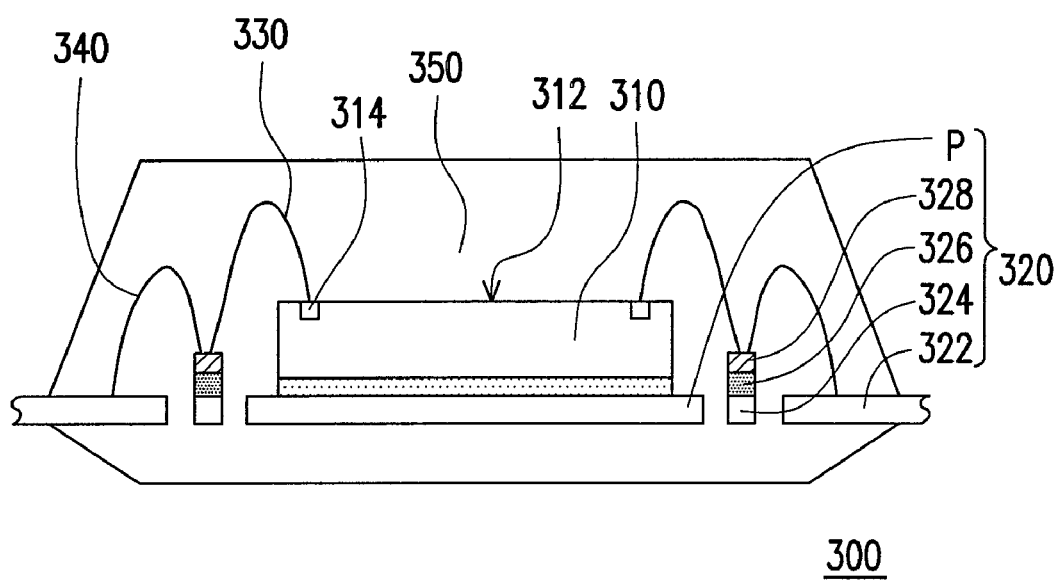

Next, referring to FIG. 5E, a wiring process is performed to form a plurality of first bonding wires 330, so as to respectively connect the chip bonding pads 314 and the transfer bonding pads 328. Then, a plurality of second bonding wires 340 is formed to respectively connect the transfer bonding pads 328 and the inner leads 322. Referring to FIG. 5F, in the second embodiment, the method of fabricating the chip package structure 300 further comprises forming an encapsulant 350 to cover the active surface 312, the die pad P, the inner leads 322, the bus bar 324, the first bonding wires 330 and the second bonding wires 340.

In view of the above, the chip package structure and the fabricating method thereof in the present invention at least have the following advantages.

1. In the present invention, the transfer bonding pads are formed on the bus bar for carrying out wire jumping, so compared with the conventional art, the bonding wires formed in the present invention are shorter and lower, thereby enhancing the reliability of the chip package structure.

2. The chip bonding pads are connected to the transfer bonding pads via the first bonding wires, and the transfer bonding pads are connected to the inner leads via the second bonding wires. In other words, the transfer bonding pads function as transfer points for the chip bonding pads being electrically connected to the inner leads correspondingly. Therefore, the first bonding wires and the second bonding wires are very short, such that the possibility of electric short circuits caused by the collapse of the first bonding wires and the second bonding wires is reduced, thereby improving the product yield of the chip package structure of the present invention.

3. As the first bonding wires and the second bonding wires are very short, the possibility of electric broken circuits caused by the collapse of the first bonding wires and the second bonding wires during the molding process or being pulled apart by the injected encapsulant is reduced, thereby improving the product yield of the chip package structure of the present invention.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:

1. A chip package structure, comprising:
    a single lead frame, comprising:
    a die pad;
    a plurality of inner leads disposed around the die pad;
    at least one bus bar located between the die pad and the inner leads, wherein the die pad is connected to the bus bar and is supported by the bus bar;
    an insulating layer disposed on the bus bar, wherein the bus bar is arranged without intersecting with the inner leads that are not connected to the bus bar;
    a plurality of transfer bonding pads disposed on the insulating layer;
    a chip disposed on the leadframe, wherein the chip has an active surface and a plurality of chip bonding pads, the chip bonding pads are disposed on the active surface;
    a plurality of first bonding wires respectively connecting the chip bonding pads and the transfer bonding pads; and
    a plurality of second bonding wires respectively connecting the transfer bonding pads and the inner leads.

2. The chip package structure as claimed in claim 1, wherein the bus bar is in an annular shape.

3. The chip package structure as claimed in claim 1, wherein the bus bar is in a strip-shape.

4. The chip package structure as claimed in claim 1, further comprising an encapsulant covering the active surface, the inner leads, the bus bar, the first bonding wires and the second bonding wires.

5. The chip package structure as claimed in claim 1, wherein the bus bar is electrically and structurally connected to a part of the plurality of inner leads.

6. The chip package structure as claimed in claim 5, wherein the bus bar is electrically and structurally connected to a part of the plurality of inner leads and the die pad.

7. A method of fabricating a chip package structure, comprising:
    providing a single lead frame having a die pad, a plurality of inner leads and at least one bus bar, wherein the bus bar is located between the die pad and the inner leads, and the die pad is connected to the bus bar and is supported by the bus bar;
    forming an insulating layer on the bus bar;
    forming a plurality of transfer bonding pads on the insulating layer;
    providing a chip having an active surface and a plurality of chip bonding pads, wherein the chip bonding pads are disposed on the active surface;
    installing the chip on the die pad, wherein the active surface is away from the die pad;
    forming a plurality of first bonding wires to respectively connect the chip bonding pads and the transfer bonding pads; and
    forming a plurality of second bonding wires to respectively connect the transfer bonding pads and the inner leads.

8. The method of fabricating the chip package structure as claimed in claim 7, further comprising forming an encapsulant covering the active surface, the die pad, the inner leads, the bus bar, the first bonding wires and the second bonding wires.

9. The method of fabricating the chip package structure as claimed in claim 7, wherein the bus bar is electrically and structurally connected to a part of the plurality of inner leads.

10. The method of fabricating the chip package structure as claimed in claim 7, wherein the bus bar is electrically and structurally connected to a part of the plurality of inner leads and the die pad.

* * * * *